(12) United States Patent
Jankowski et al.

(10) Patent No.: US 7,042,249 B2
(45) Date of Patent: May 9, 2006

(54) METHOD FOR ACTUATING A TRANSISTOR

(75) Inventors: Maciej Jankowski, Munich (DE); Stephan Rogl, Vilsheim (DE)

(73) Assignee: Infineon Technologies AG, Munich (DE)

( * ) Notice: Subject to any disclaimer, the term of this patent is extended or adjusted under 35 U.S.C. 154(b) by 62 days.

(21) Appl. No.: 10/888,323

(22) Filed: Jul. 9, 2004

(65) Prior Publication Data
US 2005/0030085 A1 Feb. 10, 2005

(30) Foreign Application Priority Data
Jul. 11, 2003 (DE) .................... 103 31 544

(51) Int. Cl.
*H03K 3/356* (2006.01)

(52) U.S. Cl. ............... 326/83; 326/81; 327/51; 327/54; 327/212

(58) Field of Classification Search ............ 326/81, 326/83; 327/201–203
See application file for complete search history.

(56) References Cited

U.S. PATENT DOCUMENTS

| 4,591,745 A | | 5/1986 | Shen | |
|---|---|---|---|---|
| 4,812,679 A | * | 3/1989 | Mahabadi | ............ 327/143 |
| 6,107,853 A | * | 8/2000 | Nikolic et al. | ............ 327/217 |
| 6,366,113 B1 | * | 4/2002 | Song | ............ 326/24 |
| 6,414,529 B1 | * | 7/2002 | Hirairi | ............ 327/218 |
| 6,476,645 B1 | * | 11/2002 | Barnes | ............ 327/51 |

* cited by examiner

*Primary Examiner*—Vibol Tan
(74) *Attorney, Agent, or Firm*—Jenkins, Wilson, Taylor & Hunt, P.A.

(57) ABSTRACT

The present invention provides a method for actuating a transistor (10) having the following steps: (a) a first predetermined positive potential is applied to a first voltage supply node (13) in a latch circuit (11), the voltage supply node (13) being coupled to a control connection on the transistor (10); (b) a reference-ground potential is applied to a second voltage supply node (14) in the latch circuit (11), the second voltage supply node (14) being connected to a source connection on the transistor (10); (c) the latch circuit (11) is set to a predetermined state, which turns the transistor (10) on or off; (d) the potential at the second voltage supply node (14) is lowered; and (e) the potential at the first voltage supply node (13) is lowered if the potential difference between the first and second voltage supply nodes (13, 14) exceeds a predetermined threshold value.

8 Claims, 3 Drawing Sheets

METHOD FOR ACTUATING A TRANSISTOR

TECHNICAL FIELD

The present invention relates to a method for actuating a transistor, and particularly to an actuation method for a transistor with a negative switching voltage, actuated using a latch structure.

BACKGROUND ART

For applications in which negative switching voltages are required, appropriate actuation voltages need to be generated for electronic switching devices, such as switching transistors. An NMOS switch requires a voltage range which extends from a negative voltage for ensuring good isolation to a predetermined voltage above this negative switched voltage, in order to permit a low forward resistance for the switching transistor.

Known switching assemblies use circuits which effectively switch digital levels, such as a reference-ground potential as available positive digital supply voltage and a negative voltage supply potential as negative digital supply voltage. The problem with such circuits, however, is that they cannot be used if the potential difference between the positive digital supply voltage and the negative digital supply voltage exceeds the breakdown voltage of the electronic switching devices used, according to their specification. Another drawback of the conventional circuit type is low immunity to interference and unreliable switching operations when too low a digital supply voltage is provided in comparison with the threshold voltage of the switching device used. The aforementioned drawbacks may be removed by providing additional negative supply voltages and by using stepped or cascaded level converters, but this makes the circuit very complex and requires additional negative supply voltages.

SUMMARY

It is therefore an object of the present invention to provide an actuation method for an electronic switching device which permits a high level of immunity to interference and reliable switching operations with a simple switching structure.

The invention achieves this object by means of the actuation method specified in claim 1 for an electronic switching device.

The idea on which the present invention is based essentially involves the use of a latch circuit to actuate the transistor at the gate, the positive latch voltage supply being tracked to the potential of the negative supply voltage. In this way, the switching devices used in the latch circuit are also subjected to a voltage such that the operating conditions of the switching devices do not exceed predetermined limit values. One advantage of the inventive solution is the simplicity of its execution. In addition, the digital, positive supply voltage is independent of the negative switched voltage, which brings about the relatively high level of immunity to interference and the reliable control under varying technological and temperature conditions.

The present invention solves the problem mentioned at the outset particularly by virtue of a method for actuating a transistor having the following steps: (a) a first predetermined positive potential is applied to a first voltage supply node in a latch circuit, the voltage supply node being coupled to a control connection on the transistor; (b) a reference-ground potential is applied to a second voltage supply node in the latch circuit, the second voltage supply node being connected to a source connection on the transistor; (c) the latch circuit is set to a predetermined state, which turns the transistor on or off; (d) the potential at the second voltage supply node is lowered; and (e) the potential at the first voltage supply node is lowered if the potential difference between the first and second voltage supply nodes exceeds a predetermined threshold value.

The subclaims contain advantageous developments and refinements of the subject matter of the invention.

In line with one preferred development, the potential at the second voltage supply node is lowered linearly, preferably in ramp form, to a predetermined negative value.

In line with another preferred development, the potential at the first voltage supply node is lowered to the reference-ground potential, preferably in steps.

In line with another preferred development, the potential difference between the first and second voltage supply nodes is provided by lowering the potential at the first voltage supply node to below the threshold value, preferably the gate-source or drain-source breakdown voltage of the electronic switching device.

In line with another preferred development, the magnitude of the potential difference between the first and second voltage supply nodes is provided to be greater than a predetermined value, preferably the magnitude of the turn-on threshold voltage of switching devices in the latch circuit.

In line with another preferred development, the transistor actuated is an NMOS transistor and/or the latch circuit actuated is a CMOS structure.

In line with another preferred development, the transistor actuated is a pass transistor.

In line with another preferred development, resetting the latch circuit in order to turn off the transistor at the gate involves raising the potential at the second voltage supply node from the predetermined negative value and preferably likewise raising the potential at the first voltage supply node on the basis of the potential difference between the first and second voltage supply nodes.

In line with another preferred development, the latch circuit is set by applying a predetermined positive potential to at least one first switching device connected to the latch circuit and/or is reset by applying a predetermined positive potential to at least one second switching device connected to the latch circuit.

An exemplary embodiment of the invention is shown in the drawing and is explained in more detail in the description below.

In the drawing:

DETAILED DESCRIPTION

In the figures, identical reference symbols denote parts which are the same or have the same function.

Figure 1:
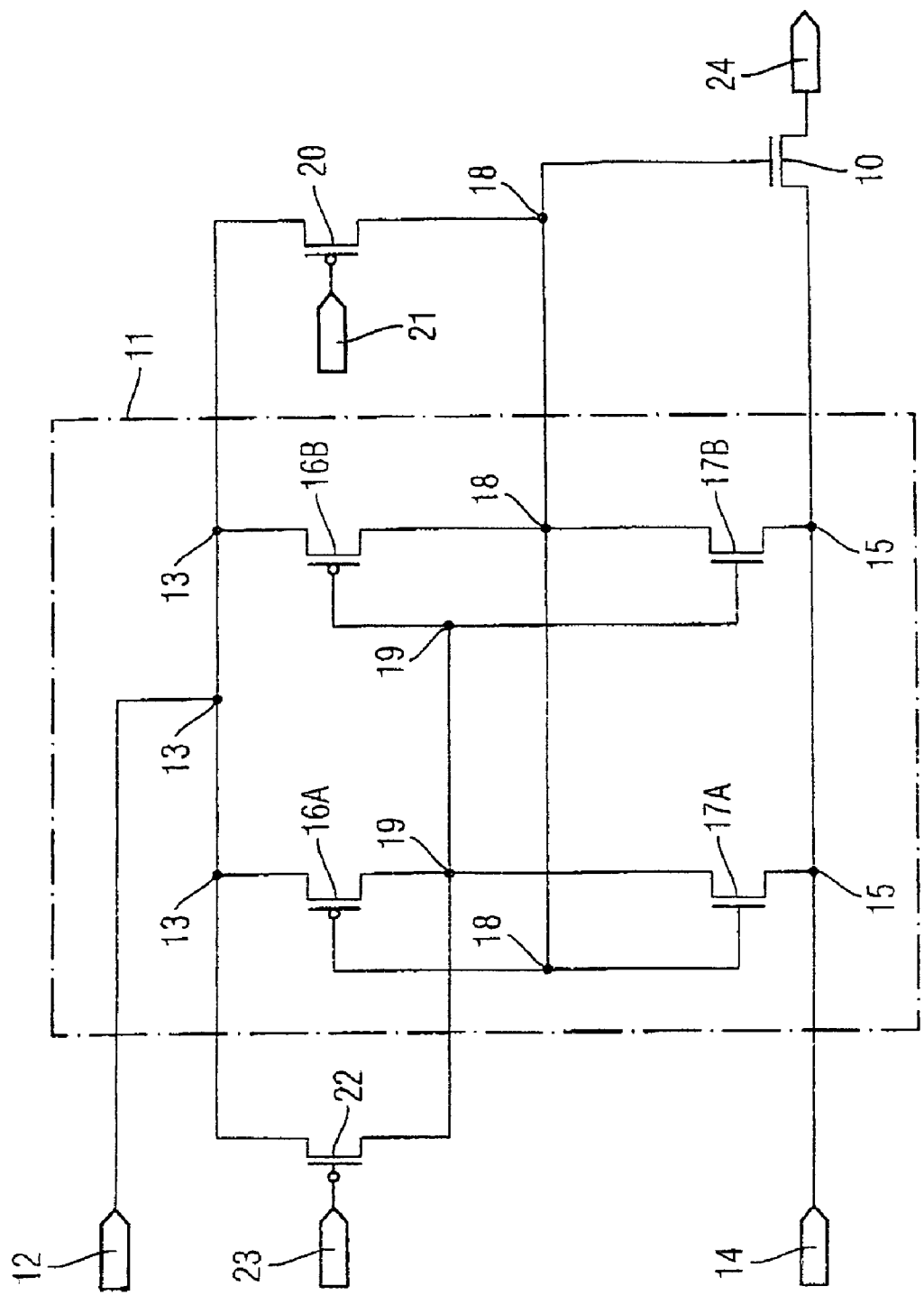
FIG. 1 shows a schematic circuit diagram to explain an embodiment of the present invention.

FIG. 1 shows a schematic actuation circuit in an electronic switching device 10, preferably in an NMOS transistor. In line with FIG. 1, the actuation circuit in the electronic switching device 10 has a latch circuit 11. The latch circuit 11 has a first voltage supply input 12, which is connected to a first voltage supply node 13. In addition, the latch circuit 11 has a second voltage supply input 14, which is connected to a second voltage supply node 15. The first voltage supply node 13 is used to apply a potential between a predetermined positive potential and a reference-ground potential. The second voltage supply node 15 is used to provide a potential in a range between the reference-ground potential and a predetermined negative potential. The second voltage supply node 15 is connected to the source of the transistor 10.

Between the first voltage supply node 13 and the second voltage supply node 15, the latch circuit 11 has two series circuits, connected in parallel with one another, which each have two series-connected switching devices 16A, 17A; 16B, 17B, preferably a PMOS and an NMOS transistor 16A, 17A; 16B, 17B. In a line 16A, 17A or 16B, 17B, the drain of one switching device 16A or 16B is connected to the first voltage supply node 13 and the source of the second switching device 17A or 17B is connected to the second voltage supply node 15, respectively. The gates of the switching devices 16A, 17A or 16B, 17B in a line are connected to one another. The gates of the transistors 16A, 17A in the left-hand line are coupled via a node 18 to the source of the first transistor 16B and to the drain of the second transistor 17B in the second line, respectively. Similarly, the gates of the transistors 16B, 17B in the right-hand line are coupled via a node 19 to the source of the first transistor 16A and to the drain of the second transistor 17A in the left-hand line, respectively.

To set and reset the latch circuit 11, i.e. to turn the transistor 10 on and off, the first voltage supply node 13 and the node 18 have a switching device 20 between them whose gate can be actuated via an input 21. The node 19 is also coupled to the voltage supply node 13 via a switching device 22, the gate of the switching device 22 having an input 23 for turning off the transistor 10 by applying a positive potential. Both the switching device 20 and the switching device 22 are preferably PMOS transistors. The drain of the transistor 10 is provided with a voltage output 24, via which the actual output signal from the actuation circuit with the latch circuit 11 is output.

The embodiment shown in FIG. 1 thus has a CMOS latch circuit 11 with setting and resetting transistors 20, 22 and a transistor 10, i.e. a switching transistor which couples the input 14 of the negative supply voltage to the voltage output 24 on the basis of the switching state of the latch circuit 11. In the embodiment shown in FIG. 1, no ground or reference-ground potential connections have been shown for reasons of simplification. The actuation circuit shown in FIG. 1 is operated as follows: first, a positive digital supply voltage, i.e. a predetermined positive potential is applied to the voltage supply input 12. A reference-ground potential is applied to the second voltage supply input 14. On the basis of this configuration, the state of the latch circuit 11 and consequently the switching state of the transistor 10 can easily be changed by applying a low positive potential to the actuation input 21 of the switching device 20 in order to turn on the transistor 10 or to the actuation input 23 of the switching device 22 in order to turn off the transistor 10. The potential of the second voltage supply input 14 is then lowered to a negative value, preferably linearly, particularly in ramp form. However, this is done under the premise that the potential difference between the potential at the first voltage supply input 12 and the second voltage supply input 14 is below a predetermined voltage. This predetermined voltage or potential difference, e.g. Vmax, corresponds to the maximum drain-source or gate-source voltage which is admissible for the switching devices used in the latch circuit 11. Vmax is preferably determined by the corresponding breakdown voltage of the respective transistors.

In order to maintain the data, i.e. the state of the latch circuit 11, in the next step, it is necessary to ensure that the magnitude of the voltage at the second voltage supply input 14 with respect to a reference-ground potential is greater than the maximum of the turn-on threshold voltage of the NMOS transistors 17A, 17B used and the magnitude of the turn-on threshold voltage of the PMOS transistors 16A, 16B, 20, 22 used. In that case, the potential at the first voltage supply input 12 is switched to the reference-ground potential, preferably in steps. In the process, the data remain in the latch circuit 11 and therefore the desired switching state of the transistor 10 remains. The switching devices 20, 22 thus become insensitive toward digital signals between the reference-ground potential and the positive supply voltage at their input 21, 23. The potential at the second voltage supply input 14 can then be lowered as far as a negative voltage greater than the predetermined negative voltage, i.e. a threshold value (>−Vmax).

This principle of tracking, i.e. lowering, the potential at the first voltage supply input 12 on the basis of the potential difference between the first voltage supply node 13 and the second voltage supply node 15 can be used to actuate any other switching transistors, such as a pass or clamp transistor, between an output voltage VOUT and a reference-ground potential VSS. If it is no longer necessary to maintain the state of the latch circuit 11, the potential at the second voltage supply input 14 can be brought directly to the reference-ground potential. Otherwise, a sequence proceeding in the opposite order to the sequence mentioned above may be used in order to make the latch circuit 11 actuable and hence to alter the switching state of the transistor 10.

Figure 2:
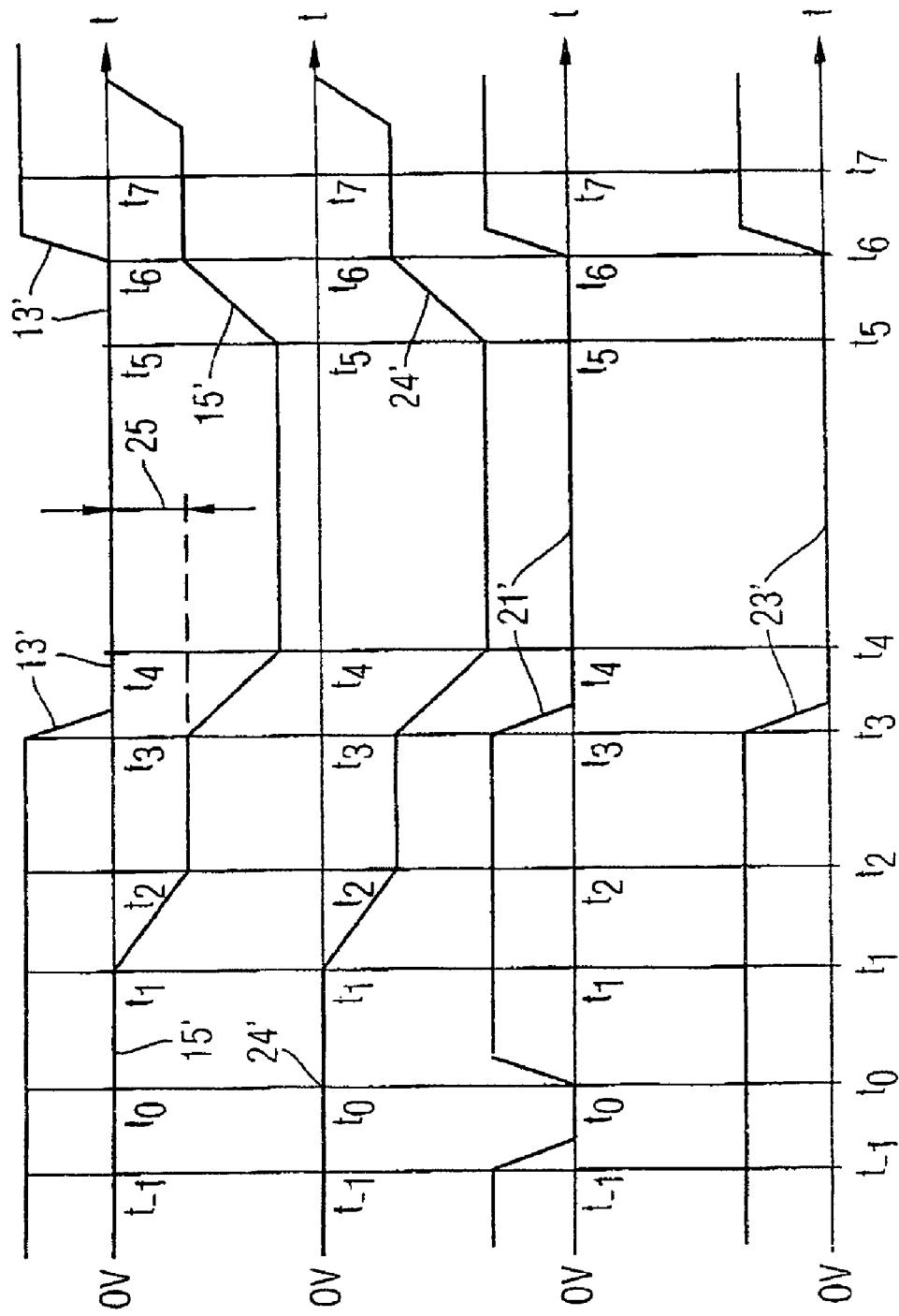
FIG. 2 shows schematic potential profiles at significant points in the circuit in order to explain the manner of operation of an embodiment of the present invention.

To explain the manner of operation of the circuit arrangement shown in FIG. 1, FIG. 2 schematically shows potential profiles 13', 15', 24', 21', 23' at significant points 13, 15, 24, 21, 23 in the circuit over time t. At the instant $t_{-1}$, a positive potential 13' is applied to the voltage supply node 13 or to the voltage supply input 12, as to the actuation input 21 and to the actuation input 23. For the purpose of setting, i.e. for the purpose of turning on, the potential 21' at the actuation input 21 is lowered to 0 volt at the instant $t_{-1}$, which turns on the PMOS transistor 20 shown in FIG. 1 and applies the positive potential to the voltage supply node 13, hence to node 18. This turns on the transistor 10.

At the instant $t_0$, the potential 21' at the actuation input 21 is raised again in order to turn off the PMOS transistor 20, since the latch device 11 has been set, which means that the transistor 10 remains on at the node 18 even while the PMOS transistor 20 is off (between instant $t_0$ and instant $t_3$).

At the instant $t_1$, the potential at the voltage supply input 14 and hence at the node 15 is now lowered, preferably in ramp form, to a predetermined negative value, which is likewise provided at the output 24 of the transistor 10. At the instant $t_2$, this first predetermined negative potential value has been reached. At the instant $t_3$, the potential at node 15 is now lowered, again in ramp form up to the instant $t_4$, to a second negative potential value. Since, in view of this measure, the potential difference for the node 13 might result in the destruction of circuit devices in a latch device 11, the potential at the node 13 is accordingly lowered from the predetermined positive potential to the reference-ground potential 0 volts, preferably abruptly. However, this can be done only if a minimum potential difference 25 is maintained between the node 13 and the node 15, so that the switching state of the latch device 11 is not lost. At the instant $t_3$, the potential at the actuation inputs 21 and 23 is likewise lowered to 0 volts in line with the potential at the node 13.

In the range between the instant $t_4$ and the instant $t_5$, the potential difference between the node 13 and the node 15 is thus lower than a predetermined maximum value, but at the same time is greater than a predetermined minimum voltage for retaining the switching state of the latch device 11. At the instant $t_5$, the potential at the node 15 and hence, on account of the transistor 10 which is on, also at the output 24 is raised up to the instant $t_6$, preferably in ramp form. So as not to drop below the minimum potential difference 25 between the nodes 13 and 15 at the instant $t_6$, the potential 13' at the node 13 is raised to the predetermined positive value, but without exceeding the predetermined maximum voltage value between nodes 13 and 15. In line with the potential profile 13' at the node 13, the potential is also raised to the predetermined positive value at the actuation inputs 21 and 23 at the instant $t_6$. At the instant $t_7$, the potential at the node 15 is then raised further up to the reference-ground potential.

To monitor the potential difference between node 13 and node 15 and particularly to observe the voltage level between the minimum predetermined voltage and the maximum predetermined voltage, a simple comparator circuit for comparison with predetermined constants is used, for example. Depending on the potential difference and possible attainment of the minimum or maximum predetermined voltage value, the voltage supply inputs 12 and 14 are actuated as appropriate at the comparator output.

Figure 3A:
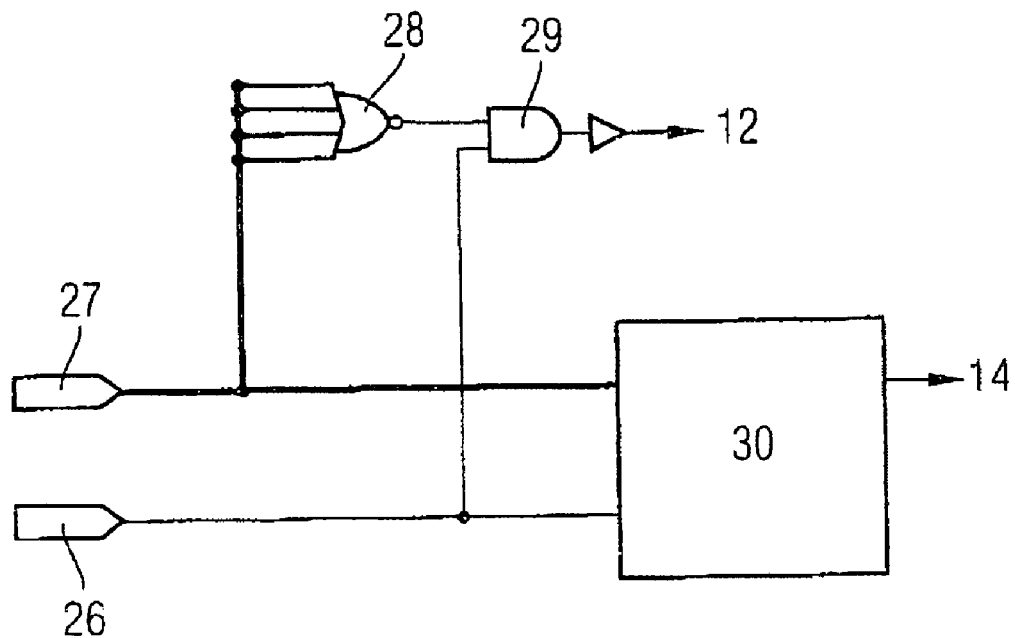
FIGS. 3A, B respectively show a schematic circuit diagram to explain a respective detail of an embodiment of the present invention.

FIG. 3a shows a first actuation circuit for generating the voltage supply levels for the inputs 12 and 14 shown in FIG. 1. An actuation signal 26 and a second, preferably 4-bit, signal 27 are to this end applied to a charge pump. In this case, the actuation signal 26 serves merely to activate or deactivate the charge pump 30. By contrast, the preferably 4-bit signal 27 selectively controls the output variable from the charge pump 30 for the voltage supply input 14. The 4-bit signal 27 is supplied in parallel to a logic gate 28, preferably a NOR gate. The output of the logic device 28 is logically combined, by means of an AND function 29, with the actuation signal 26 for the charge pump 30 and is then supplied to the voltage supply input 12 shown in FIG. 1.

Figure 3B:
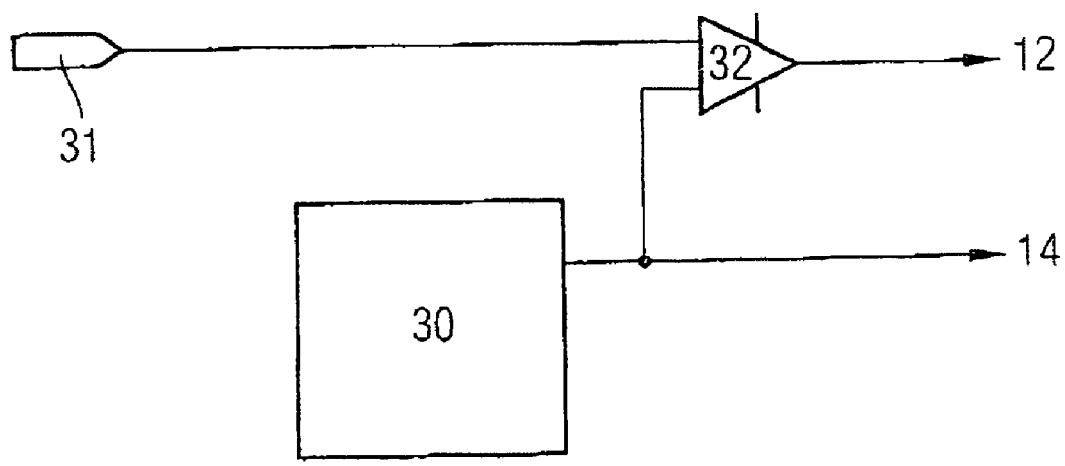

FIG. 3b shows a schematic circuit for generating the potential difference between the voltage supply input 12 and 14, i.e. the voltage supply nodes 13 and 15. In this case, a reference voltage 31 and the output value, predetermined for the voltage supply input 14, from the charge pump 30 are supplied to the input of an operational amplifier 32, whose output signal is sent to the voltage supply input 12.

Although the present invention has been described above with reference to a preferred exemplary embodiment, it is not limited thereto but rather may be modified in a wide variety of ways. Thus, besides the latch circuit 11 described, an alternative latch circuit, particularly one having different switching devices 16A, 16B, 17A, 17B, is also possible. In addition, the stated switching devices in the form of PMOS and NMOS transistors may likewise be implemented in complementary form or in another fashion.

List of Reference Symbols

| | |
|---|---|
| 10 | Transistor, e.g. NMOS transistor |
| 11 | Latch circuit |
| 12 | Voltage supply input |
| 13 | Voltage supply node |
| 14 | Voltage supply input |
| 15 | Voltage supply node |
| 16A | Switching device, preferably PMOS transistor |
| 16B | Switching device, preferably PMOS transistor |
| 17A | Switching device, preferably NMOS transistor |
| 17B | Switching device, preferably NMOS transistor |
| 18 | Node |
| 19 | Node |
| 20 | Switching device, preferably PMOS transistor |
| 21 | Actuation input |
| 22 | switching device, preferably PMOS transistor |
| 23 | Actuation input |
| 24 | Voltage output |
| 25 | Minimum voltage between nodes 13 and 15 |
| 26 | Actuation signal |
| 27 | Signal, preferably 4 bits wide |
| 28 | Logic gate, preferably NOR gate |
| 29 | AND function |
| 30 | Charge pump |
| 31 | Reference voltage |
| 32 | Operational amplifier |
| 13' | Potential profile at node 13 |
| 15' | Potential profile at node 15 |
| 21' | Potential profile at input 21 |
| 23' | Potential profile at input 23 |
| 24' | Potential profile at input 24 |
| t | Time |
| $t_{-1}$–$t_7$ | Instants |
| V | Voltage |

What is claimed is:

1. A method for actuating a transistor having the following steps:
   (a) a first predetermined positive potential is applied to a first voltage supply node in a latch circuit, the voltage supply node being coupled to a control connection on the transistor;
   (b) a reference-ground potential is applied to a second voltage supply node in the latch circuit, the second voltage supply node being connected to a source connection on the transistor;
   (c) the latch circuit is set to a predetermined state, which turns the transistor on or off;
   (d) the potential at the second voltage supply node is lowered linearly, preferably in ramp form, as far as a predetermined negative potential; and
   (e) the potential at the first voltage supply node is lowered if the potential difference between the first and second voltage supply nodes exceeds a predetermined threshold value.

2. The method as claimed in claim 1, wherein the potential at the first voltage supply node is lowered to the reference-ground potential, preferably in steps.

3. The method as claimed in claim 1, wherein the potential difference between the first and second voltage supply nodes is provided by lowering the potential at the first voltage supply node to below the gate-source or drain-source breakdown voltage as the threshold value of switching devices in the latch circuit.

4. The method as claimed in claim 1, wherein the magnitude of the potential difference between the first and second voltage supply nodes is provided to be greater than a predetermined value, preferably the magnitude of the turn-on threshold voltage of switching devices in the latch circuit.

5. The method as claimed in claim 1, wherein the transistor actuated is an NMOS transistor and/or the latch circuit actuated is a CMOS structure.

6. The method as claimed in claim 1, wherein the transistor actuated is a pass transistor.

7. The method as claimed in claim 1, wherein resetting the latch circuit in order to turn off the transistor at the gate involves raising the potential at the second voltage supply node and preferably likewise raising the potential at the first voltage supply node on the basis of the potential difference between the first and second voltage supply nodes.

8. The method as claimed in claim 1, wherein the latch circuit is set by applying a predetermined potential to at least one first switching device connected to the latch circuit and/or is reset by applying a predetermined potential to at least one second switching device connected to the latch circuit.

* * * * *